United States Patent
Albertini et al.

(10) Patent No.: US 6,333,470 B1
(45) Date of Patent: Dec. 25, 2001

(54) ASSEMBLY FOR CHIP(S) WITH MAGNETIC HEAD(S) AND METHOD FOR MAKING SAME

(75) Inventors: Jean-Baptiste Albertini, Grenoble; Gérard Barrois, Le Fontanil; Roger Marillat, Voreppe, all of (FR)

(73) Assignee: Commissariat A L'Energie Atomique, Paris (FR)

( * ) Notice: Subject to any disclaimer, the term of this patent is extended or adjusted under 35 U.S.C. 154(b) by 0 days.

(21) Appl. No.: 09/529,376
(22) PCT Filed: Aug. 20, 1999
(86) PCT No.: PCT/FR99/02020
   § 371 Date: Jun. 21, 2000
   § 102(e) Date: Jun. 21, 2000
(87) PCT Pub. No.: WO00/11665
   PCT Pub. Date: Mar. 2, 2000

(30) Foreign Application Priority Data

Aug. 21, 1998 (FR) .................................................. 98 10614

(51) Int. Cl.[7] .............................. H05K 1/16; G11B 5/127
(52) U.S. Cl. ..................... 174/260; 174/254; 174/255; 361/760; 361/792; 361/749; 29/832; 29/603.04; 29/603.05
(58) Field of Search ..................................... 174/260, 254, 174/255, 268, 267, 72 A, 72 R, 52.4, 52.2; 361/760, 749, 750, 751, 792, 795, 794, 743, 820; 29/832, 603.04, 603.05, 603.06; 257/713

(56) References Cited

U.S. PATENT DOCUMENTS

| | | |
|---|---|---|
| 4,223,360 | 9/1980 | Sansom et al. . |
| 4,759,119 * | 7/1988 | Noguchi .................................. 29/603 |
| 5,666,717 * | 9/1997 | Matsumoto et al. ............... 29/603.12 |
| 5,857,257 * | 1/1999 | Inaba .................................. 29/603.04 |
| 5,870,258 * | 2/1999 | Khan et al. ......................... 360/245.9 |
| 5,978,177 * | 11/1999 | Takasugi ............................ 360/245.9 |
| 6,031,693 * | 2/2000 | Takahashi et al. .................... 360/114 |
| 6,034,852 * | 3/2000 | Nakano ................................ 360/137 |

FOREIGN PATENT DOCUMENTS

| | | |
|---|---|---|
| 61085616 | 5/1986 | (EP) . |
| 04087010 | 3/1992 | (EP) . |
| 07129936 | 5/1995 | (EP) . |
| 09180143 | 7/1997 | (EP) . |
| 10074305 | 3/1998 | (EP) . |

* cited by examiner

Primary Examiner—Jeffrey Gaffin
Assistant Examiner—J B Patel
(74) Attorney, Agent, or Firm—Burns Doane Swecker & Mathis LLP

(57) ABSTRACT

An assembly including a magnetic head for recording information using a chip based assembly. The assembly includes a chip mounted on a base where a printed circuit with conducting tracks underneath is passed through the base to come into contact with the chips's connection studs. Also disclosed is the process for the manufacture of chip based assemblies.

7 Claims, 5 Drawing Sheets

ASSEMBLY FOR CHIP(S) WITH MAGNETIC HEAD(S) AND METHOD FOR MAKING SAME

FIELD OF THE INVENTION

This invention involves an assembly for chip(s) with magnetic head(s) and a process for manufacturing the assembly.

It can be applied in particular to manufacturing helicoid recording heads on magnetic tape, for example for amateur or professional video recording (home VCRs or camcorders) or also for digital data recorders which use tapes or disks. There could also be other applications for other types of recording heads (linear on tape, on cards, etc.).

The high frequencies which are possible due to the small size of the magnetic heads integrated in thin layers allow for digital recording (for example with the DVC norm for video or DDS for data recording). Tape data recording systems are for mass data storage with the highest capacities and at the lowest cost. Its computer applications are archiving of data and backups of hard disks of systems or networks for distribution of large programs or databases.

STATE OF THE ART

FIGS. 1 to 3 in appendix illustrate the structure of a magnetic head integrated in thin layers which is known from document FR-A-2 747 226. As illustrated in FIG. 1, the head includes two polar pieces $10_1$, $10_2$ separated by a head gap 14, two magnetic branches $16_1$, $16_2$ which partly cover the polar pieces, and a magnetic piece for flux closure 18. This set of pieces constitutes a magnetic circuit. Around the branches $16_1$, $16_2$ there are conducting windings $20_1$, $20_2$ for reading and/or writing of the information written and/or read on the recording support which is not shown.

FIG. 2 shows the complete head with two conducting strips $22_1$, $22_2$ allowing for access to the conducting windings $20_1$, $20_2$ and two electrical connection studs $24_1$, $24_2$.

The head shown in FIGS. 1 and 2 can be made collectively using micro-electronics techniques. To obtain a chip with one or several magnetic heads from a card which includes several components or chips, the components must be separated from each other and then the front part of the components which will be next to the polar pieces $10_1$, $10_2$ must be machined to give them the rounded shape needed for proper functioning of the head. In FIG. 2, the rounded profile is schematically represented by the line 26.

FIG. 3 schematically shows a section view of a head along a line AA which goes through one of the conducting strips and one of the branches of the magnetic circuit as well as the head support. This figure shows a substrate 30, silicon for example, with one of the polar pieces $10_1$ or $10_2$, a magnetic branch $16_1$ or $16_2$, a conducting strip $22_1$ or $22_2$, and the electrical connection studs $24_1$, $24_2$. This unit is covered by a superstrate 40, in silicon for example. At the front of the head, the surface 26, called the bearing surface, has an appropriately rounded shape and a height h which is reduced with respect to the total thickness of the unit. At the back, the superstrate 40 is disengaged to leave the electrical connection studs $24_1$, $24_2$ exposed.

The chip is mounted on a base 45, made of brass for example, on one of the sides of which (front side or back side) there is a rigid printed circuit 46, which is electrically linked to the chip by stranded wires $48_1$, $48_2$. The printed circuit 46 links the head to the electronic circuits which control writing and/or reading.

In an assembly of this type, four welds must be done for a chip containing a single head: two welds of the stranded wires $48_1$, $48_2$ on the studs of the printed circuit 46 and two other welds on the connection studs $24_1$, $24_2$, on the back of the chip. If the chip contains a double head, there will be four connection studs on the back of the head and eight welds will be needed.

The existence of these welds increases the resistance of the overall circuit. The soldering, done manually, using ultrasound with microscope observation for example, is expensive. It also limits the speed of production and requires qualified personnel. These operations are particularly delicate when the size of the head is small: they must then be done with micro-handling tools to arrange the wires on the studs. Since the general trend is toward smaller heads, these difficulties will only become greater.

This invention aims to overcome these drawbacks.

SUMMARY OF THE INVENTION

To this end, the invention proposes a chip-base assembly which avoids the use of stranded wires. The invention also proposes a process for making this assembly, which can be automated. According to the invention, the rigid printed circuit (46 in FIG. 3) is eliminated and a printed circuit with conducting tracks which have ends which come directly into contact with the connection studs of the chip is used. At their opposite ends, the conducting tracks are linked to the electronic circuit which controls the chip.

More precisely, this invention involves an assembly for chip(s) with magnetic head(s), the aforesaid chip including a rear edge equipped with electrical connection studs, the assembly also including a base with upper and lower sides as well as front and back edges, the chip being attached to the front edge of the upper side of the base, this assembly being characterised in that it also includes a printed circuit having an upper side and a lower side, a front edge and a back edge as well as an opening or a notch, this printed circuit being covered, on its lower side, by conducting tracks with front ends soldered to the electrical connection studs of the chip, the printed circuit going under the base and having its upper side against the lower side of the base, the rear part of the base and the rear part of the printed circuit being attached to each other by a means of attachment, the opening or notch of the printed circuit being crossed by the base.

The means of attachment could be glue or a screw. In the latter case, this screw could attach the printed circuit to the base and then attach both of them to a drum.

The printed circuit can be flexible and made of Mylar, Kapton, polyimide or any other material suitable for such circuits. But the printed circuit may also be rigid (for example plastic or other material). The conducting tracks may be photoetched. Their edges may be first covered with a meltable product (tin-lead for example) on the parts facing the electrical connection studs of the chip.

To facilitate the assembling of this unit, the printed circuit can preferably have a notch or opening which is crossed by the base.

The chip can have one or several magnetic heads and each base can be associated with several chips.

This invention also involves a process for making the assembly which has just been described. According to this process:

starting with a chip with at least one magnetic head and with its rear edge equipped with electrical connection studs and a base having upper and lower sides and front and rear edges, the chip is attached to the front edge of the upper side of the base, a printed circuit is made with upper and lower sides and front and rear edges with, on the lower side, conducting tracks. A notch or opening is made in the printed circuit with dimensions sufficient for the chip-base unit to go through it, the chip-base unit is then passed through the notch or opening in the printed circuit and the electrical connection studs of the chip are arranged facing the ends of the conducting tracks of the printed circuit, the electrical connection studs of the chip are electrically connected with the ends of the conducting tracks of the printed circuit, part of the base is attached to the printed circuit.

The invention eliminates the connection wires and reduces by half the number of welds to be done for a normal integrated head, thus reducing the number of operations and parts. The electrical resistance of the circuit is also decreased.

The invention process can be automated. For this, there can be a machine with a distributor of heads already mounted on their base (revolver loader type for example) and a printed circuit distributor (pre-printed circuit roll for example) which can cut the flexible circuits. The assembly is placed in the hole in the printed circuit and then the circuit is soldered to the connection studs of the head. For miniaturised heads, the positioning of the printed circuit on the base-chip set could be done with a video camera and a shape recognition program. In this case the labour involved is only supplying the machine with sub-units for processing and then collecting the mounted heads in a collector when they come out of the machine.

This automation, which is made possible by the invention, considerably reduces the cost of the assemblies.

DESCRIPTION OF PARTICULAR EMBODIMENTS

Figure 1:
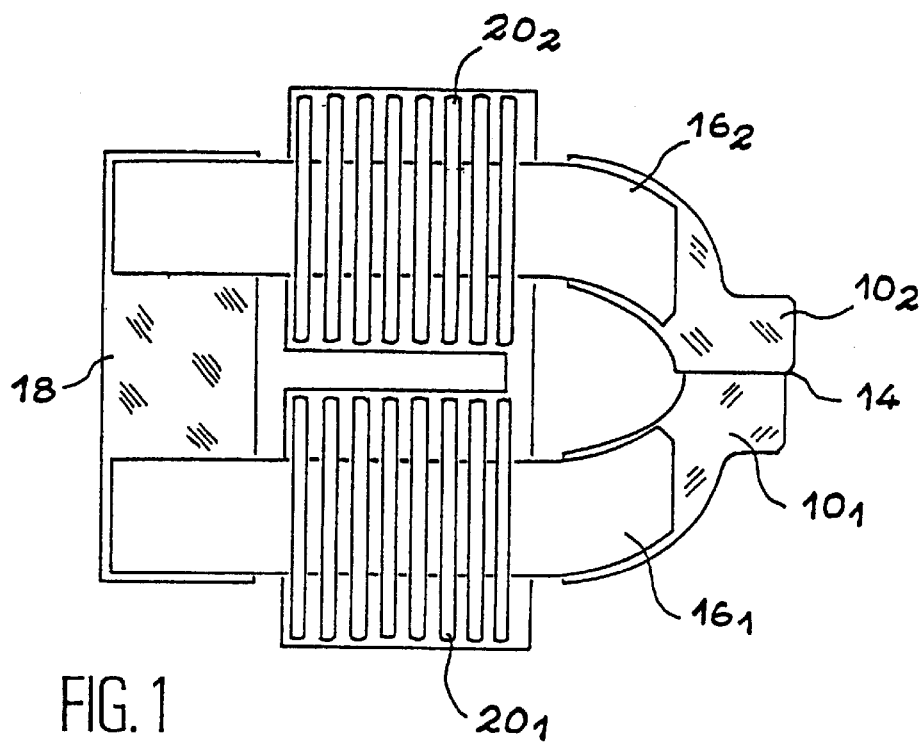
FIG. 1, already described, shows a magnetic head according to the state of the art.
Figure 2:
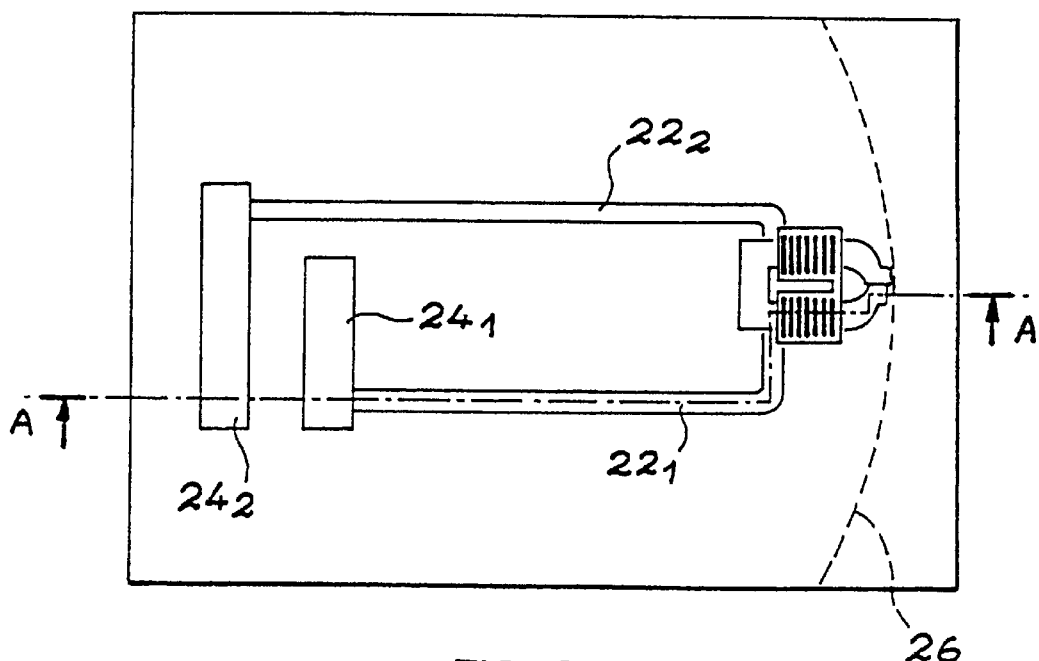
FIG. 2, already described, shows, in an overhead view, a magnetic head with its magnetic connection studs.
Figure 3:
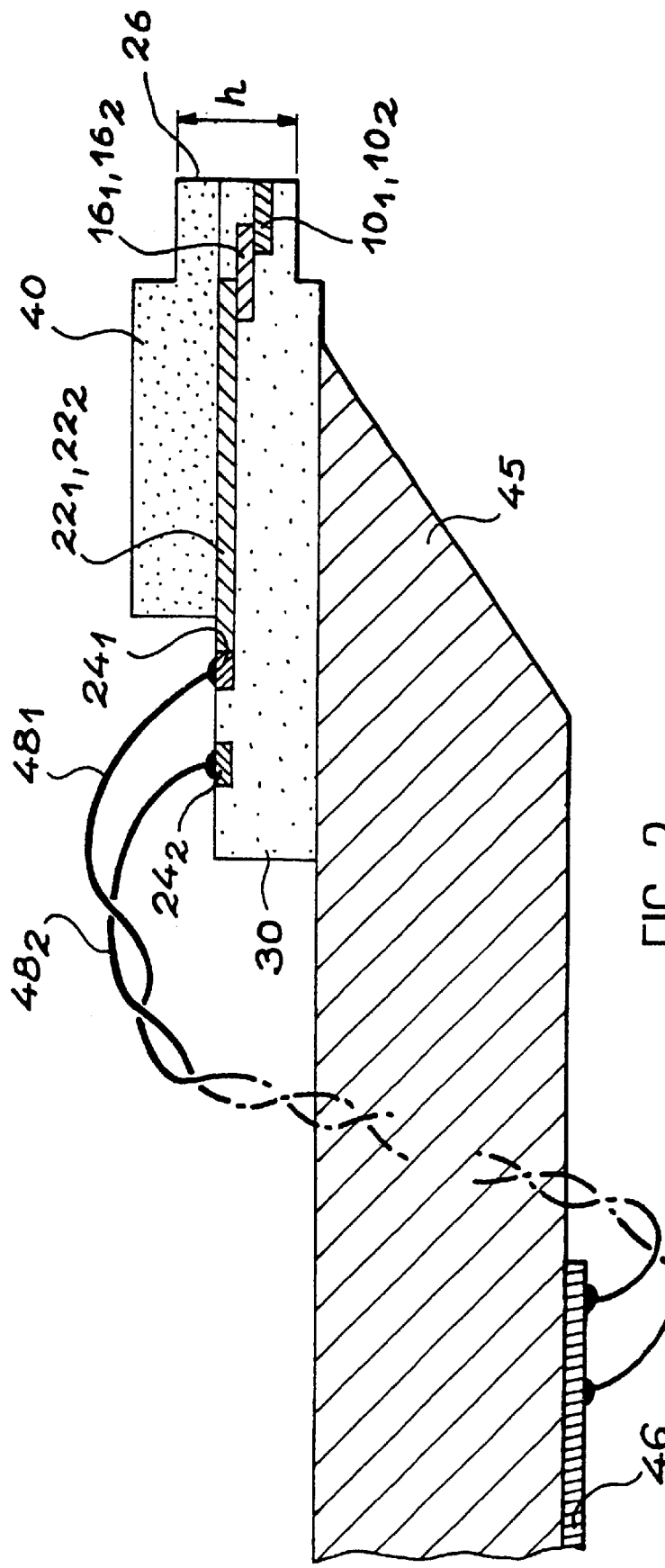
FIG. 3, already described, shows the same head in a cross-section and assembled on its base.
Figure 4:
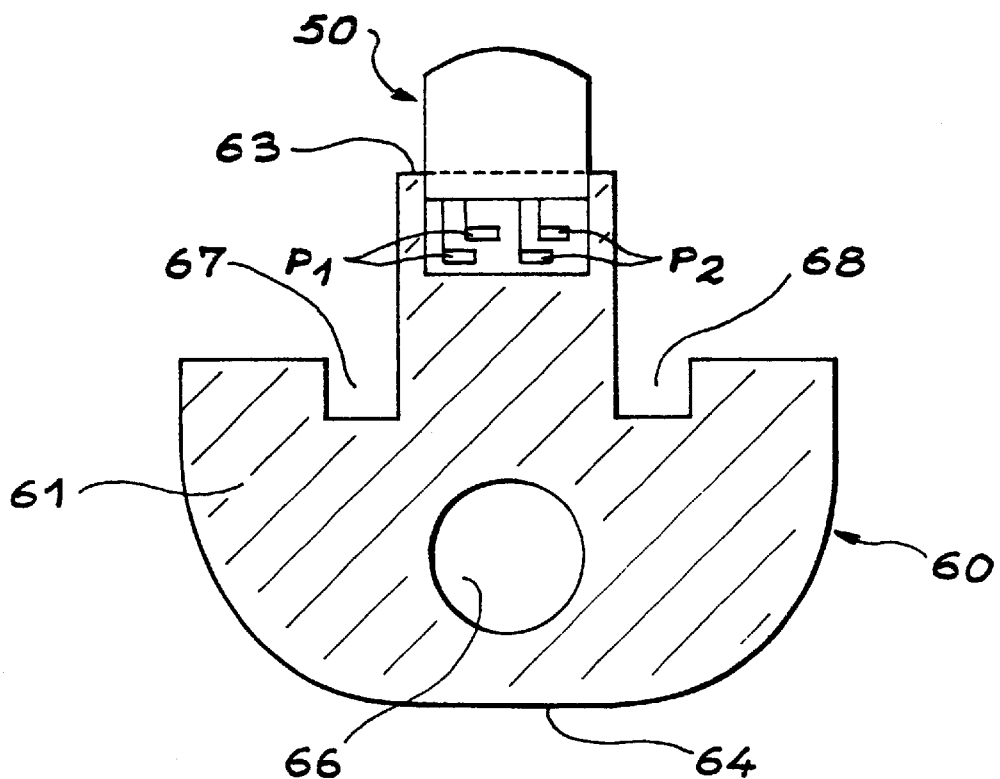
FIG. 4 is an overhead view of a part of the assembly according to the invention.

FIG. 4 shows a chip 50 which is assumed to contain two magnetic heads. The chip thus includes, on its rear edge, two double electrical connection studs, $P_1$, $P_2$. There is also a base 60 with an upper side 61, a front side 63 and a rear side 64. This base is pierced with a hole 66 to allow for insertion of the means of attachment. In its middle part, the base has two notches 67, 68. The chip 50 is mounted on the upper side of the base 60, towards the front edge 63.

Figure 5:
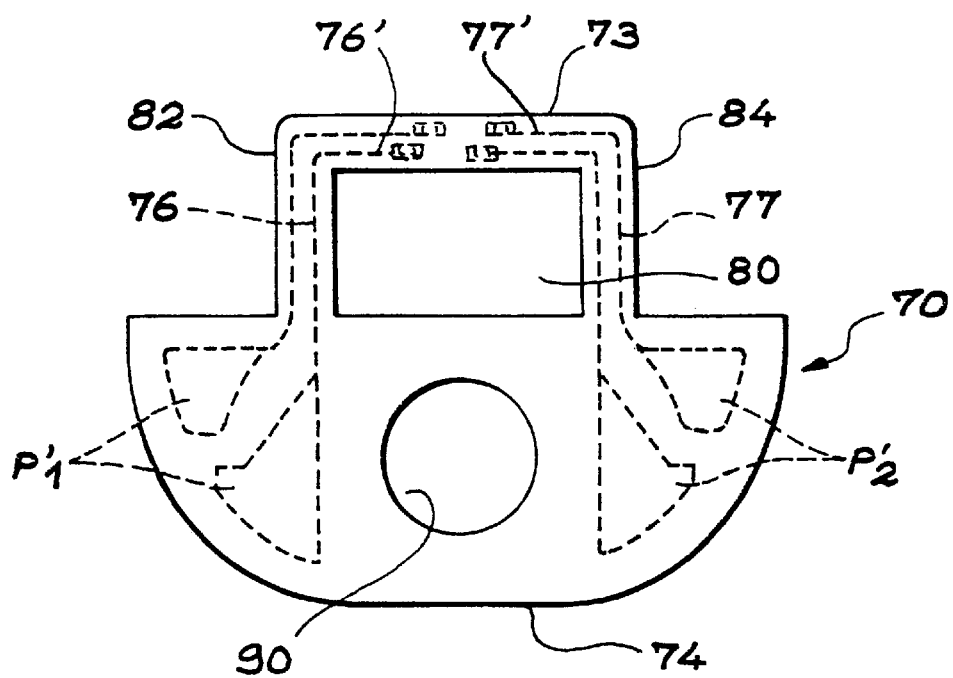
FIG. 5 is an overhead view of a printed circuit.

FIG. 5 shows a printed circuit 70 with a front edge 73 and a rear edge 74, conducting tracks 76, 77 arranged on the lower side of the circuit, these tracks having front ends 76', 77' placed so that they are above the connection studs P1, P2 of the chip when the flexible circuit will be in place. At the rear ends of the conducting tracks 76 and 77, there are two pairs of connection studs $P'_1$, $P'_2$ which can connect with an electronic circuit which is not shown.

The printed circuit 70 also includes an opening 80 which is essentially rectangular and bordered by two lateral strips 82, 84. This opening 80 is sufficiently wide so that the chip-base unit in FIG. 4 can be put into it. The lateral strips 82, 84 of the flexible circuit go through the notches 67, 68 in the base. The printed circuit contains a hole 90, of the same diameter as the hole 66 made in the base to allow for insertion of the means of attachment.

Figure 6:
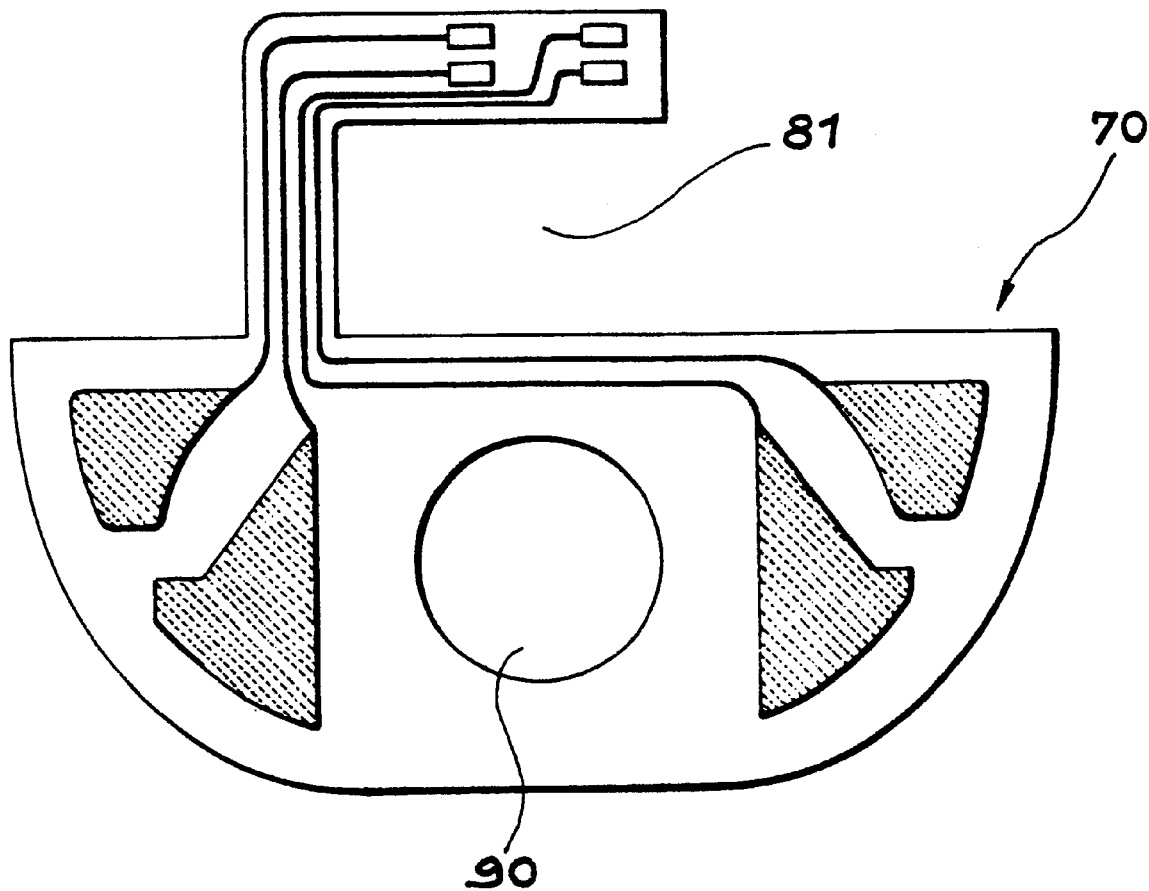
FIG. 6 shows a variant of the notch.

FIG. 6 shows a variant of the printed circuit in which there is no opening like the opening 80 in FIG. 5, but with a single lateral branch with a notch 81.

Figure 7:
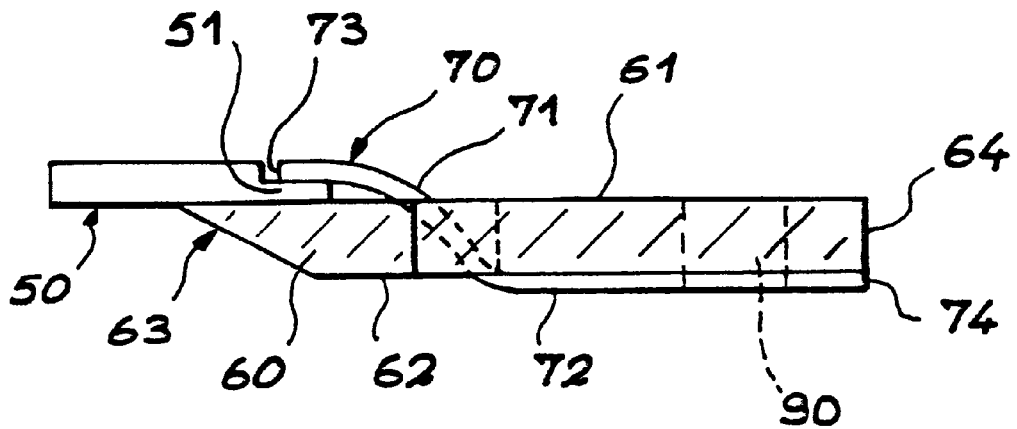
FIG. 7 is a side view of an assembly according to the invention.
Figure 8:
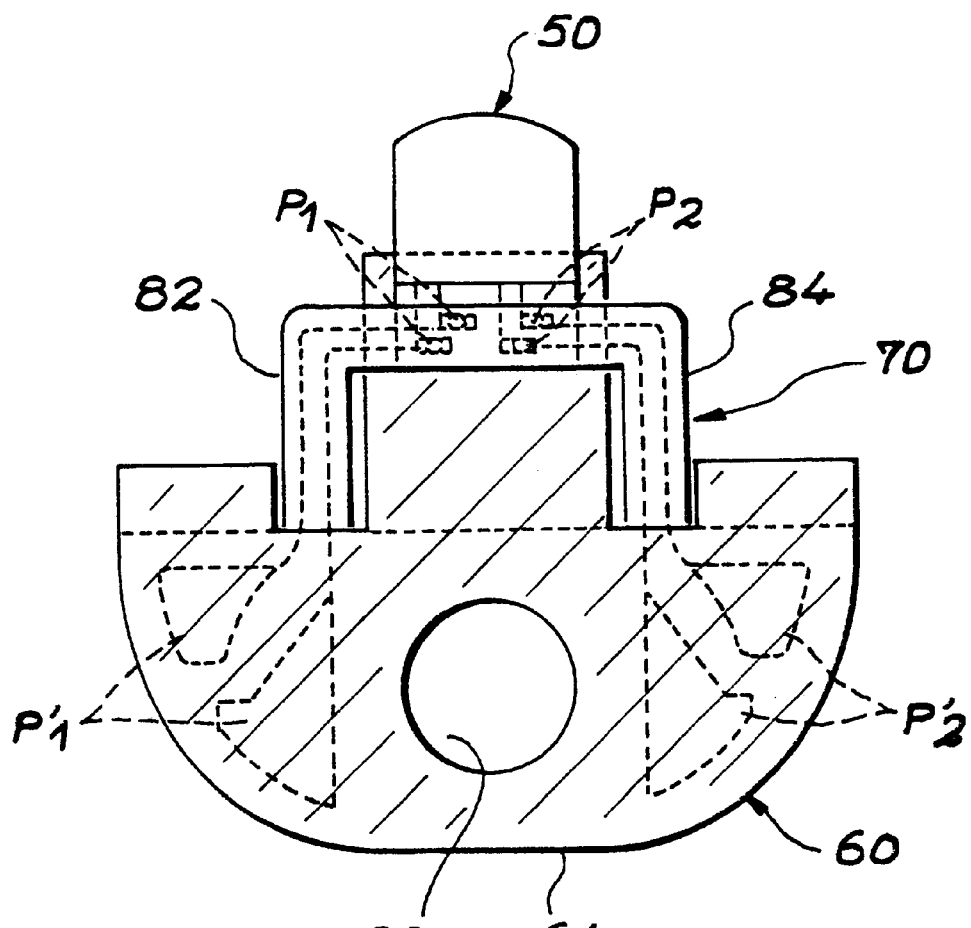
FIG. 8 is an overhead view of an assembly according to the invention.

FIGS. 7 and 8 show the assembly obtained, respectively in side view and overhead view. The references indicate the same elements as in FIGS. 4 and 5. FIG. 7 shows, in particular, the deformation of the printed circuit 70, with its upper side 71 which is under the lower side 62 of the base 60 and its lower side 72 which comes in contact with the connection studs of the chip 50. FIG. 7 also shows a means of attachment 92 in the form of a screw or nut.

FIG. 8 shows the same elements and also the lateral sides 82 and 84 which go into the notches in the base.

These sides can be pre-folded and possibly glued to the lateral sides of the base to limit vibrations.

The printed circuit may be rigid and, in this case, the invention can be combined with the invention described and claimed in the French patent application entitled "Assembly including a chip with magnetic head(s) embedded in a base" submitted by the present Applicant on the same day as the submission of the present application. This invention includes a housing in the base to embed at least part of the chip, possibly with a cap over this chip. This cap can be made of the front part of the printed circuit which has just been described, in a variant in which the circuit is rigid.

What is claimed is:

1. Assembly including chip(s) with magnetic head(s), the aforesaid chip (50) having a rear edge equipped with electrical connection studs ($P_1$, $P_2$), the assembly also including a base (60) with an upper side (61) and a lower side (62) as well as a front edge (63) and a rear edge (64), the chip (50) being attached to the front edge (63) of the upper side (61) of the base (60), this assembly being characterized in that it also includes a printed circuit (70) with an upper side (71) and a lower side, front edge (73) and a rear edge (74) as well as an opening (80) or a notch (81), this printed circuit (70) being covered, on its lower side (72) by conducting tracks (76, 77) of which the front ends (76', 77') are soldered to the electrical connection studs ($P_1$, $P_2$) of the chip, the printed circuit (70) going under the base (60) and having its upper side (71) against the lower side (62) of the base (60) and the rear part (74) of the printed circuit (70) being attached to each other by a means of attachment, the opening (80) or notch (81) of the printed circuit being crossed by the base (60).

2. Assembly according to claim 1, in which the notch (81), respectively the opening (80) made in the printed circuit (70) is bordered laterally by one, respectively two lateral strip(s) (82, 84) which go along one side or both sides of the base (60).

3. Assembly according to claim 2, in which the lateral strip(s) (82, 84) are glued to the base (60).

4. Assembly according to claim 1, in which the printed circuit (70) and the base (60) are each pierced by a hole (66, 90).

5. Assembly according to claim 1, in which the printed circuit is flexible.

6. Assembly according to claim 1, in which the printed circuit is rigid.

7. Process for making an assembly comprising:

- Starting with a chip with at least one magnetic head and with its rear edge equipped with electrical connection studs ($P_1$, $P_2$) and a base (60) having upper (61) and lower (62) sides and front (63) and rear (64) edges,
- Attaching the chip (50) to the front edge (63) of the upper side (61) of the base (60),
- Making a printed circuit (70) with upper (71) and lower (72) sides and front (73) and rear (74) edges with, on the lower side (72), conducting tracks (76,77), A notch (81) or opening (80) is made in the printed circuit (70) with dimensions sufficient for the chip-base unit (50, 60) to go through it,
- Passing the chip base-unit (50,60) through the notch (81) or opening (80) in the printed circuit (70) and the electrical connection studs ($P_1$, $P_2$) of the chip (50) are arranged facing the ends (76',77') of the conducting tracks (76,77) of the printed circuit,
- Electrically connecting the electrical connection studs ($P_1$, $P_2$) of the chip (50) with the ends (76',77') of the conducting tracks (76,77) of the printed circuit (70),
- Attaching at least one part (64) of the base (60) to the printed circuit (70).

* * * * *